United States Patent
Yokotani et al.

[11] Patent Number: 6,107,793
[45] Date of Patent: *Aug. 22, 2000

[54] MAGNETIC SENSING DEVICE UNAFFECTED BY POSITIONING ERROR OF MAGNETIC FIELD SENSING ELEMENTS

[75] Inventors: Masahiro Yokotani; Yasuyoshi Hatazawa, both of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/890,670

[22] Filed: Jul. 9, 1997

[30] Foreign Application Priority Data

Feb. 10, 1997 [JP] Japan ..................................... 9-026736

[51] Int. Cl.[7] ................. G01B 7/14; G01B 7/30
[52] U.S. Cl. ................ 324/207.21; 324/207.25; 324/207.2
[58] Field of Search ............ 324/207.21, 207.2, 324/207.23, 207.24, 207.25, 207.26, 252, 251; 338/32 H, 32 R

[56] References Cited

U.S. PATENT DOCUMENTS 5,021,736 6/1991 Gonsalves et al. ................. 324/207.21

FOREIGN PATENT DOCUMENTS

| 0 709 689 A2 | 5/1996 | European Pat. Off. . |
| 195 07 304 A1 | 9/1995 | Germany . |
| 0168381 | 9/1984 | Japan ............................... 324/207.21 |
| 0168382 | 9/1984 | Japan ............................... 324/207.21 |

OTHER PUBLICATIONS

*Journal of Magnetics Society of Japan*, vol. 15, No. 5, 1991 "Magnetoresistance of Multilayers".

*Primary Examiner*—Jay Patidar
*Attorney, Agent, or Firm*—Sughrue, Mion, Zinn, Macpeak & Seas, PLLC

[57] ABSTRACT

A sensing device outputs a square wave signal whose edges exactly correspond to edges of protruding or recessed portions of a rotary magnetic-material member, regardless of the positioning accuracy of a magnetic field detecting element with respect to the location of a magnet. The sensing device includes: a magnet for generating a magnetic field; a rotary magnetic material member for changing the magnetic field generated by the magnet, the rotary magnetic material member being disposed a predetermined distance apart from the magnet; and a magnetic field detecting element whose resistance changes in response to the change in the magnetic field induced by the magnetic field variation inducing means; wherein the surface of the magnet facing the magnetic field detecting element is slanted.

7 Claims, 7 Drawing Sheets

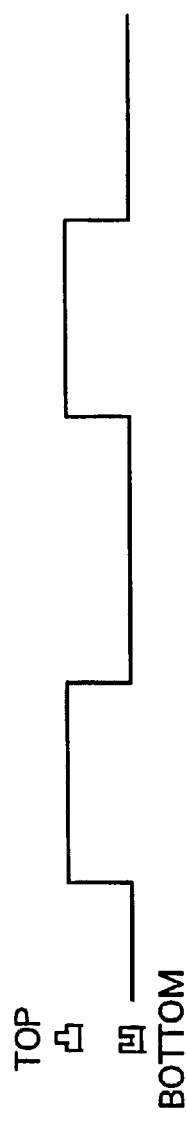
FIG. 3A
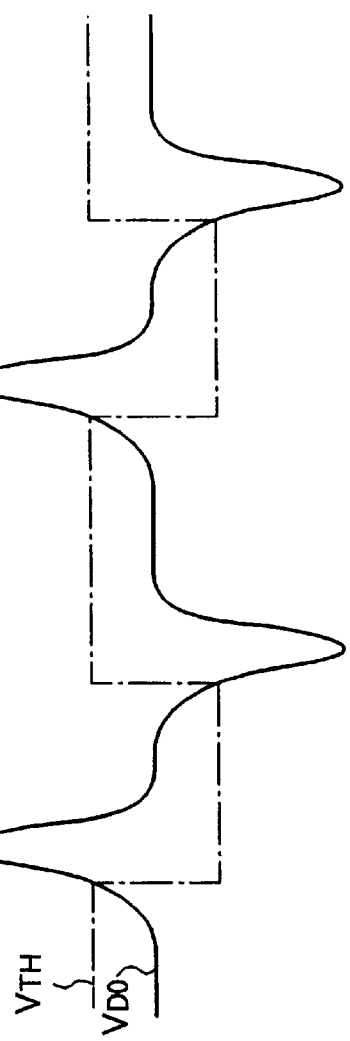
FIG. 3B OUTPUT OF DIFFERENTIAL AMPLIFIER
FIG. 3C OUTPUT OF WAVEFORM SHAPING CIRCUIT

OUTPUT OF
DIFFERENTIAL
AMPLIFIER

OUTPUT OF
WAVEFORM
SHAPING CIRCUIT

6,107,793

MAGNETIC SENSING DEVICE UNAFFECTED BY POSITIONING ERROR OF MAGNETIC FIELD SENSING ELEMENTS

BACKGROUND OF THE INVENTION

1. Field of the Invention

The present invention relates to a sensing device for detecting the change in an applied magnetic field, and more particularly, to a sensing device which is particularly suitable for detecting the information about the rotation of, for example, an internal combustion engine.

2. Description of the Related Art

FIG. 7 is a schematic diagram illustrating the construction of a conventional sensing device, wherein its side view and perspective view are shown in FIG. 7A and FIG. 7B, respectively.

This sensing device includes: a rotating shaft 1; a rotary magnetic material member 2 serving as magnetic field variation inducing means having at least one protruding or recessed portion, wherein the rotary magnetic material member 2 is adapted to rotate in synchronization with the rotation of the rotating shaft 1; a magnetic field detecting element 3 disposed at a location a predetermined distance apart from the rotary magnetic material member 2; and a magnet 4 for applying a magnetic field to the magnetic field detecting element 3, wherein the magnetic field detecting element 3 includes a magnetoresistance pattern (not shown) formed on a thin film plane (magnetic field sensing plane) 3a of the magnetic field detecting element 3. The magnetic field detecting element 3 is fixed to the magnet 4 via a fixing member of a non-magnetic material (not shown).

In the above construction, the magnetic field applied to the magnetic field sensing plane 3a of the magnetic field detecting element 3 changes in response to the rotation of the rotary magnetic material member 2, and a corresponding change occurs in the resistance of the magnetoresistance pattern.

FIG. 8 is a block diagram illustrating a conventional sensing device using magnetic field detecting elements.

This sensing device includes: a Wheatstone bridge circuit 11, including magnetic field detecting elements disposed a predetermined distance apart from the rotary magnetic material member 2 so that a magnetic field is applied from a magnet 4 to the magnetic field detecting elements; a differential amplifier 12 for amplifying the output signal of the Wheatstone bridge circuit 11; a comparator 13 for comparing the output of the differential amplifier 12 with a reference value and outputting a "0" signal or a "1" signal depending on the comparison result; a waveform shaping circuit 14 for shaping the waveform of the output of the comparator 13 and supplying a "0" or "1" signal having sharply rising and falling edges to an output terminal 15.

FIG. 9 is a circuit diagram illustrating a specific example of the circuit shown in FIG. 8.

The Wheatstone bridge circuit 11 includes magnetic field detecting elements 10A, 10B, 10C, and 10D disposed on the respective branches of the bridge, wherein one end of the magnetic field detecting element 10A and one end of the magnetic field detecting element 10C are connected in common to a power supply terminal $V_{cc}$ via a node 16, one end of the magnetic field detecting element 10B and one end of the magnetic field detecting element 10D are connected in common to ground via a node 17, the other end of the magnetic field detecting element 10A and the other end of the magnetic field detecting element 10B are connected to a node 18, and the other end of the magnetic field detecting element 10C and the other end of the magnetic field detecting element 10D are connected to a node 19.

The node 18 of the Wheatstone bridge circuit 11 is connected via a resistor to the inverting input of an amplifier 12a of the differential amplifier 12. The node 19 is connected via a resistor to the non-inverting input of the amplifier 12a and further connected via a resistor to a voltage divider serving as a reference power supply.

The output of the amplifier 12a is connected to the inverting input of a comparator 13. The non-inverting input of the comparator 13 is connected via a resistor to a voltage divider serving as a reference power supply wherein the non-inverting input of the comparator 13 is also connected via a resistor to the output of the comparator 13.

The output of the comparator 13 is connected to the base of a transistor 14a of a waveform shaping circuit 14. The collector of the transistor 14a is connected to an output terminal 15 and also to a power supply terminal $V_{cc}$ via a resistor. The emitter of the transistor 14a is grounded.

The operation will be described below with reference to FIG. 10.

If the rotary magnetic material member 2 rotates, the magnetic field changes in response to the protruding and recessed portions of the rotary magnetic material member 2 shown in FIG. 10A, and this magnetic field changing in magnitude is equally applied to both the magnetic field detecting elements 10A and 10D constituting the Wheatstone bridge circuit 11, whereas the magnetic field detecting elements 10B and 10C experience a magnetic field which is opposite in phase to that applied to the magnetic field detecting elements 10A and 10D. Thus, the magnetic field sensing planes of the respective magnetic field detecting elements experience a change in the magnetic field corresponding to the protruding and recessed portions of the rotary magnetic material member 2. As a result, the overall magnitude of the change in the magnetic field becomes, in effect, four times greater than that which can be sensed by a single magnetic field detecting element. Thus, the magnetic field detecting elements 10A and 10D have maximum and minimum resistances at locations opposite in phase to those where the magnetic field detecting elements 10B and 10C have maximum and minimum resistances. As a result, the voltages at the nodes 18 and 19 (mid-point voltages) of the Wheatstone bridge circuit also change in a similar fashion.

The difference between the mid-point voltages is amplified by the differential amplifier 12. Thus, as represented by the solid line in FIG. 10B, the differential amplifier 12 outputs a signal $V_{DO}$ corresponding to the passage of the protruding and recessed portions of the rotary magnetic material member 2 shown in FIG. 10A. The output signal of the differential amplifier 12 is substantially four times greater than can be obtained when a single magnetic field detecting element is used.

The output of the differential amplifier 12 is supplied to the comparator 13, and is compared with the reference value or the threshold value $V_{TH}$. The comparator 13 outputs a "0" or "1" signal in accordance with the comparison result. The output signal of the comparator 13 is shaped by the waveform shaping circuit 14 so that the output signal has sharply rising and falling edges, and has a "0" or "1" level as represented by the solid line in FIG. 10C.

In the conventional sensing device described above, the magnetic field applied to the magnetic field detecting elements varies depending on the positioning accuracy of the magnetic field detecting elements relative to the location of the magnet. This causes a variation in the output of the differential amplifier, which in turn causes an error in the edge position of the output signal of the waveform shaping circuit, wherein the edges of the output signal should correspond exactly to the edges of the protruding and recessed portions of the rotary magnetic material member.

The above problem will be described in further detail below with reference to FIGS. 10 and 11.

In FIG. 11, when the magnetic field detecting element 3 is precisely located at a correct position with respect to the magnet 4, as represented by the solid line, the magnetic field emerging from the magnet 4 passes at a right angle through the magnetic field sensing plane of the magnetic field detecting element 3. In this case, therefore, no problems occur. However, if the location of the magnetic field detecting element 3 with respect to the magnet 4 is shifted from the correct position, the magnetic field emerging from the magnet 4 no longer passes at a right angle through the magnetic field sensing plane of the magnetic field detecting element 3. This means that the direction of the magnetic field vector varies depending on the accuracy of the location of the magnetic field detecting element 3, and a corresponding variation occurs in the bias magnetic field applied to the magnetic field detecting element 3. In particular when a plurality of magnetic field detecting elements are used, as in the example described above with reference to FIG. 9, a positioning error of the magnetic field detecting elements causes a variation in the direction of the magnetic field vector applied to each magnetic field detecting element, and a large variation occurs in the bias magnetic field applied to each magnetic field detecting element.

As a result of the above positioning error, as represented by the broken line in FIG. 10B, the output $V_{DO}$ of the differential amplifier 12 is shifted from the correct position represented by the solid line. The output of the waveform shaping circuit 14 and thus the output of the sensing device no longer correspond exactly to the protruding and recessed portions of the rotary magnetic material member 2, as represented by the broken line in FIG. 10C. In other words, the edges of the output signal of the sensing device are shifted from the correct positions.

In view of the above problems, it is an object of the present invention to provide a sensing device capable of a high-accuracy output signal whose edges correspond exactly to the protruding and recessed portions of a rotary magnetic material member regardless of a positioning error of a magnetic field detecting element with respect to the location of a magnet.

SUMMARY OF THE INVENTION

According to an aspect of the present invention, there is provided a sensing device including: magnetic field generating means for generating a magnetic field; magnetic field variation inducing means for changing the magnetic field generated by the magnetic field generation means, the magnetic field variation inducing means being disposed a predetermined distance apart from the magnetic field generation means; and a magnetic field detecting element whose resistance changes in response to the change in the magnetic field induced by the magnetic field variation inducing means; wherein the surface of the magnetic field generating means at the end facing the magnetic field detecting element is slanted.

In this construction, the positioning error of the magnetic field detecting element causes a lesser change in the magnetic field applied to the magnetic field detecting element, and thus causes a lesser change in the output signal of the magnetic field detecting element. This ensures that the output signal exactly corresponds to the change in the magnetic field induced by the magnetic field variation inducing means, and thus the detection accuracy is improved.

In one form of the invention, the magnetic field generating means is realized by a magnet whose surface at an end facing the magnetic field detecting element is either formed into a curved surface or into triangular-shaped planes. Furthermore, the magnetic field variation inducing means is realized by a rotary magnetic material member having at least one protruding or recessed portion.

According to this arrangement, the positioning error of the magnetic field detecting element causes a lesser change in the magnetic field applied to the magnetic field detecting element, and thus causes a lesser change in the output signal of the magnetic field detecting element. This ensures that the output signal exactly corresponds to the protruding or recessed portion of the rotary magnetic material member, and thus the detection accuracy is improved.

In another form of the invention, the magnetic field generating means is composed of a magnet and a magnetic flux guide whose surface on the side facing the magnetic field detecting element is slanted into a predetermined shape. Furthermore, the magnetic field variation inducing means is realized by a rotary magnetic material member having at least one protruding or recessed portion.

According to this arrangement, the positioning error of the magnetic field detecting element causes a lesser change in the magnetic field applied to the magnetic field detecting element, and thus causes a lesser change in the output signal of the magnetic field detecting element. This ensures that the output signal exactly corresponds to the protruding or recessed portion of the rotary magnetic material member, and thus the detection accuracy is improved. In this arrangement, it is no longer required to perform the difficult process of forming the surface of the magnet into a curved shape.

BRIEF DESCRIPTION OF THE DRAWINGS

FIGS. 3A–3C are positional and waveform diagrams illustrating the operation of the first embodiment of the sensing device according to the present invention;

DESCRIPTION OF THE PREFERRED EMBODIMENTS

The sensing device of the present invention will be described in further detail below with reference to preferred embodiments in conjunction with the drawings.

Embodiment 1

Figure 1A:
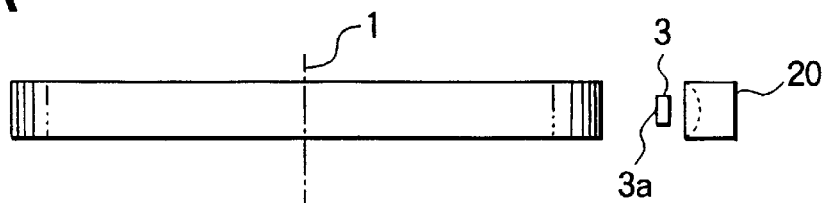
FIGS. 1A and 1B are a side view and a plan view, respectively, illustrating a first embodiment of a sensing device according to the present invention.
Figure 1B:
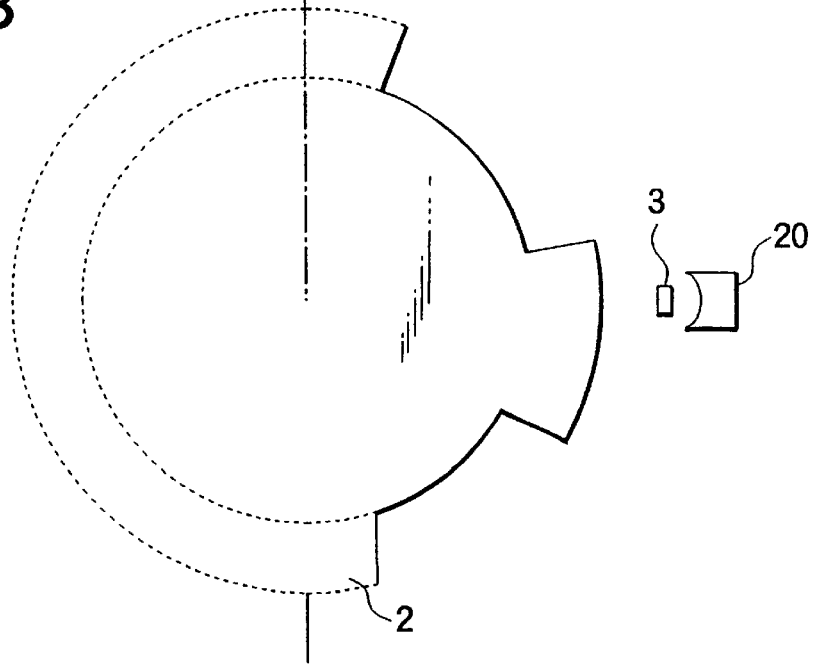
Figure 7A:
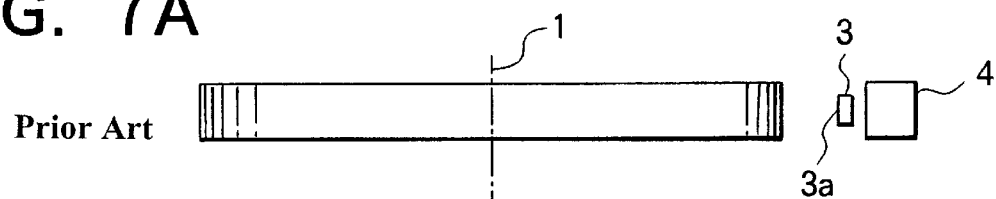
FIGS. 7A and 7B are a side view and a plan view, respectively, illustrating a conventional sensing device.
Figure 7B:
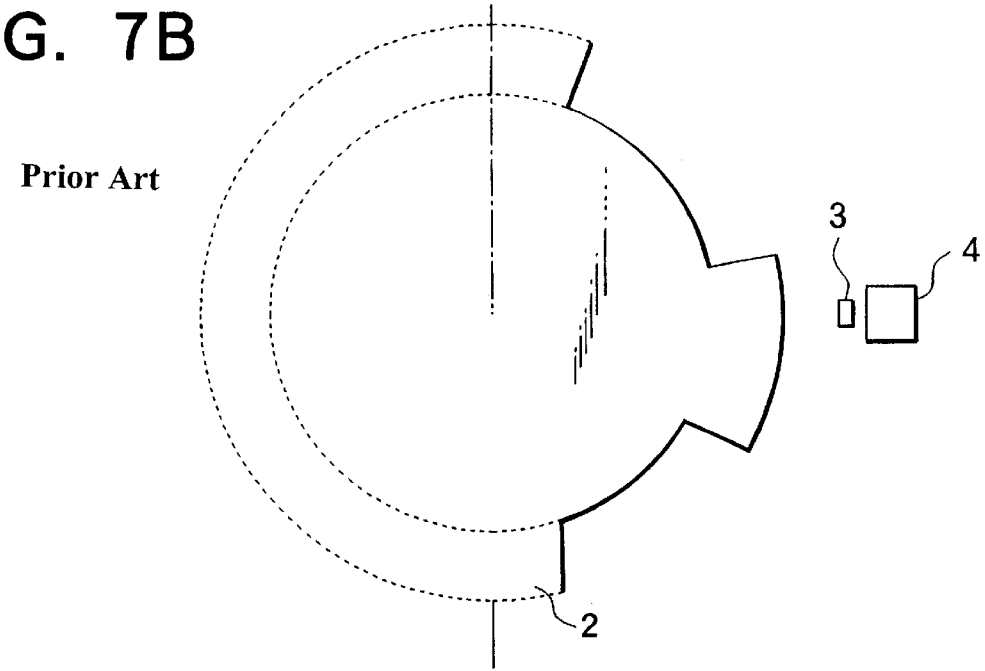

FIG. 1 is a schematic diagram illustrating a first embodiment of the present invention, wherein a side view and plan view are shown in FIGS. 1A and 1B, respectively, and wherein elements or parts similar to those in FIG. 7 are denoted by similar reference numerals, and they are not described in further detail here.

In the present embodiment, the surface of a magnet, at an end facing the magnetic field sensing plane of a magnetic field detecting element, is slanted (or curved) into a predetermined shape so that the magnetic field emerging from the magnet passes at a right angle through the magnetic field sensing plane of the magnetic field detecting element, regardless of the positioning accuracy of the magnetic field detecting element with respect to the location of the magnet.

As for the magnetic field detecting element used in the present embodiment, a magnetoresistance (MR) element or a giant magnetoresistance (GMR) element may be employed.

These elements will be described briefly below.

MR devices generally refer to those devices whose resistance changes in response to the direction of a magnetic field applied to a thin film of a ferromagnetic material (such as Ni—Fe or Ni—Co), with respect to the direction of a current flowing through the thin ferromagnetic film.

Magnetoresistance devices have a minimum resistance when a magnetic field is applied in a direction at a right angle to the direction of current. On the other hand, when the angle between the direction of the current and the direction of the applied magnetic field is 0, that is when a magnetic field is applied in a direction equal to or opposite to the direction of current, the resistance has a maximum value. The change in the resistance is generally called the magnetoresistance effect, and the magnitude of the change in the resistance is referred to as the magnetoresistance variation ratio. A typical value of magnetoresistance variation ratio is 2 to 3% for Ni—Fe and 5 to 6% for Ni—Co.

In this sensing device, the giant magnetoresistance device 10 has a multilayer structure consisting of alternately grown magnetic layers and non-magnetic layers each having a thickness in the range from a few Å to a few tens of Å. Such a multilayer structure is known as a superlattice structure, and a specific example is disclosed in a paper entitled "Magnetoresistance effect of superlattice" published in the Journal of Magnetics Society of Japan, Vol. 15, No. 51991, pp. 813–821. Specific structures includes (Fe/Cr)n, (permalloy/Cu/Co/Cu)n, (Co/Cu)n, etc. These superlattice structures exhibit much greater magnetoresistance effect (giant magnetoresistance effect) than conventional magnetoresistance devices. In these giant magnetoresistance devices with superlattice structure, the magnetoresistance effect depends only on the relative angle between magnetization of adjacent magnetic layers, and therefore the change in resistance does not depend on the direction of the external magnetic field applied with respect to the direction of current (this property is referred to as "in-plane magnetic field sensitivity").

In FIG. 1, the magnet 20 used as magnetic field generating means in the present embodiment has a properly slanted or curved surface facing the magnetic field sensing plane 3a of the magnetic field detecting element 3. The curved surface is formed so that the magnetic field emerging from the magnet 20 passes at a right angle through the magnetic field sensing plane 3a of the magnetic field detecting element 3 regardless of the positioning accuracy of the magnetic field detecting element 3 with respect to the location of the magnet 20. Furthermore, the magnet 20 is located so that the center of the curved surface of the magnet 20 is coincident with the center of the magnetic field sensing plane 3a of the magnetic field detecting element 3.

Figure 8:
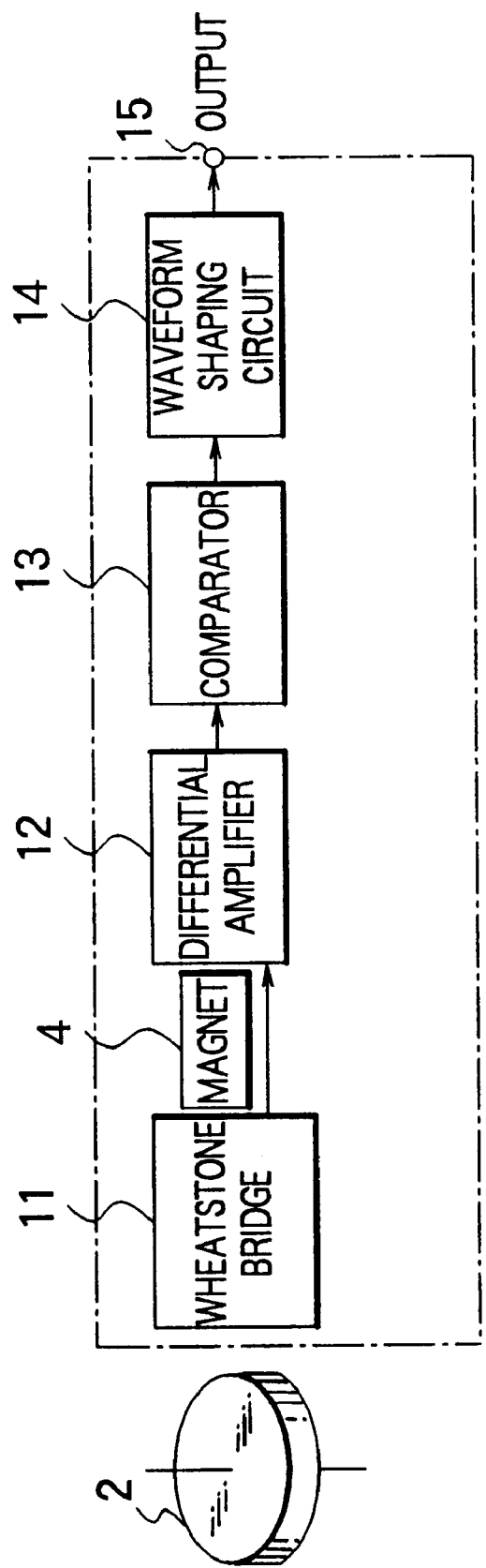
FIG. 8 is a block diagram illustrating the circuit configuration of a sensing device using a magnetic field detecting element.
Figure 9:
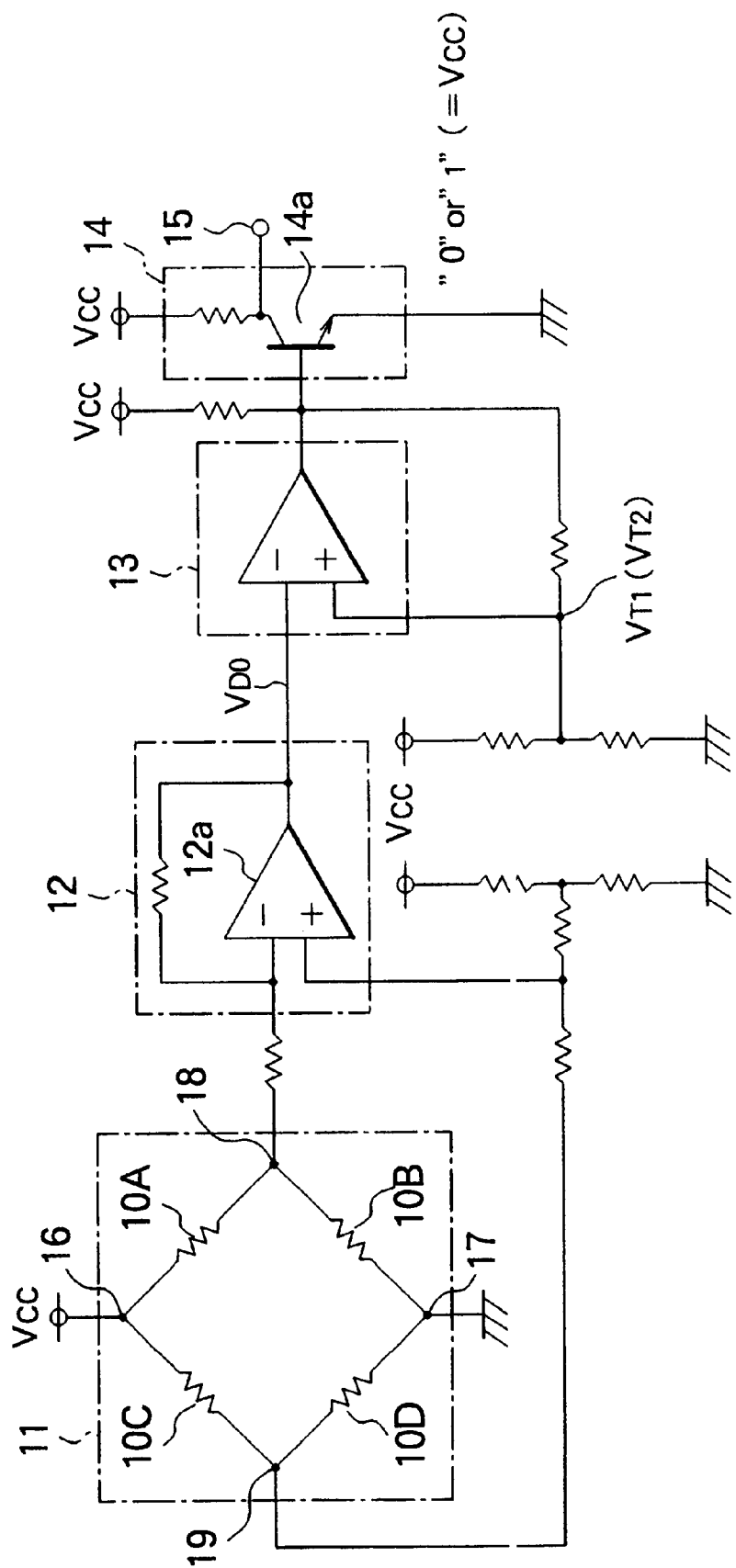
FIG. 9 is a circuit diagram illustrating a specific example of the circuit shown in FIG. 8.
Figure 10A:
FIGS. 10A–10C are positional and waveform diagrams illustrating the operation of the circuit shown in FIG. 9.
Figure 10B:
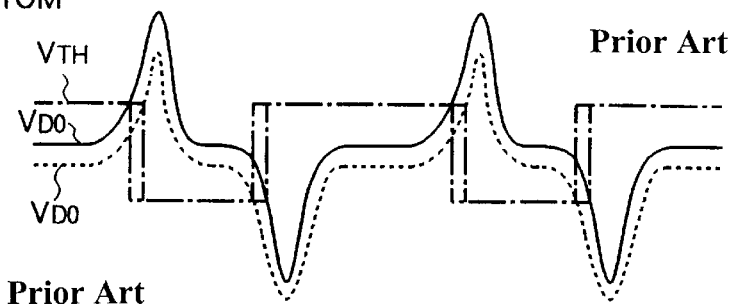
Figure 10C:
Figure 11:
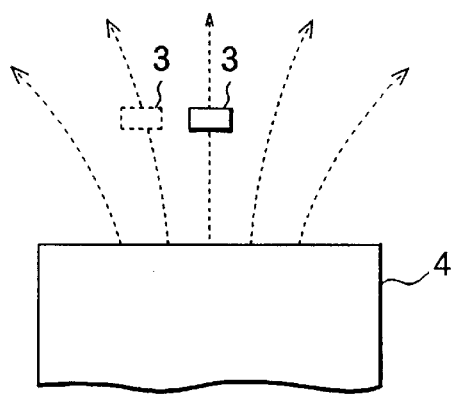
FIG. 11 is a schematic diagram illustrating a magnetic field emerging from a magnet and being directed toward a magnetic field detecting element of a sensing device according to a conventional technique.

Except for the above point, the sensing device is constructed in the same manner as the device described above with reference to FIG. 7. The basic circuit configuration of the present embodiment may be similar to that shown in the block diagram of FIG. 8 and may be implemented into a specific form similar to that shown in FIG. 9, and is not described in further detail here.

The operation of the sensing device of the present embodiment will be described below with reference to FIG. 3.

If the rotary magnetic material member 2 rotates, the magnetic field applied to the magnetic field detecting elements 10A to 10D changes in response to the passage of the protruding and recessed portions of the rotary magnetic material member 2 as shown in FIG. 3A, wherein the magnetic field applied to the magnetic field detecting elements 10A and 10D is, in effect, opposite in phase to that applied to the magnetic field detecting elements 10B and 10C. As a result, the magnetic field sensing planes of the magnetic field detecting elements 10A and 10D, and also those of elements 10B and 10C, experience the change in the magnetic field corresponding to the protruding and recessed portions of the rotary magnetic material member 2. In this construction, therefore, the overall magnitude of the change in the magnetic field becomes, in effect, four times greater than that which can be sensed when only a single magnetic field detecting element is used, and a corresponding change in resistance occurs in each magnetic field detecting element. Thus, the magnetic field detecting elements 10A and 10D have maximum and minimum resistances at locations opposite in phase to those where the magnetic field detecting elements 10B and 10C have maximum and minimum resistances. As a result, the voltages at the nodes 18 and 19 (mid-point voltages) of the Wheatstone bridge circuit 11 also change in a similar fashion.

Figure 2:
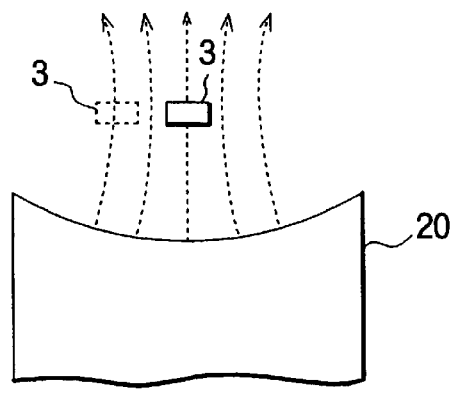
FIG. 2 is a schematic diagram illustrating a magnetic field emerging from a magnet and being directed toward a magnetic field detecting element of the sensing device according to the first embodiment of the invention.

In the construction of the present embodiment, the magnetic field emerging from the magnet 20 is directed toward the magnetic field detecting element 3 as follows. Since the surface of the magnet 20 facing the magnetic field sensing plane of the magnetic field detecting element 3 is curved as shown in FIG. 2, the magnetic field emerging from the magnet 20 passes at a right angle through the magnetic field sensing plane of the magnetic field detecting element 3 not only when the magnetic field detecting element 3 is located at a correct position as represented by the solid line in FIG. 2, but even when the location of the magnetic field detecting element 3 is shifted from the center of the magnet 20 as represented by the broken line. Therefore, the positioning error of the magnetic field detecting element 3 causes only a slight change in the direction of the magnetic field vector, and substantially no change occurs in the bias magnetic field applied to the magnetic field detecting element 3.

The difference between the mid-point voltages at the nodes 18 and 19 of the Wheatstone bridge circuit 11 is amplified by the differential amplifier 12. The differential amplifier 12 outputs a signal corresponding to the protruding and recessed portions of the rotary magnetic material member 2 shown in FIG. 3A. The output signal of the differential amplifier 12 is substantially two times greater than can be obtained by a single giant magnetoresistance device as shown in FIG. 3B.

The output of the differential amplifier 12 is supplied to the comparator 13, and is compared with the reference value, or threshold value, $V_{TH}$. The comparator 13 outputs a "0" or "1" signal in accordance with the comparison result. The waveform of this signal is then shaped by the waveform shaping circuit 14, and an output signal having a "0" or "1" level, with sharply rising and falling edges, is obtained via the output terminal 15 as shown in FIG. 3C.

In this embodiment, as described above, the surface of the magnet facing the magnetic field sensing plane of the magnetic field detecting element is curved so that even if the location of the magnetic field detecting element is shifted from the correct position with respect to the surface of the magnet, the magnetic field emerging from the magnet passes at a right angle through the magnetic field sensing plane of the magnetic field detecting element regardless of the positioning accuracy of the magnetic field detecting element with respect to the location of the magnet, thereby making it possible to obtain a detection output signal corresponding exactly to the protruding and recessed portions of the rotary magnetic material member.

Embodiment 2

Figure 4:
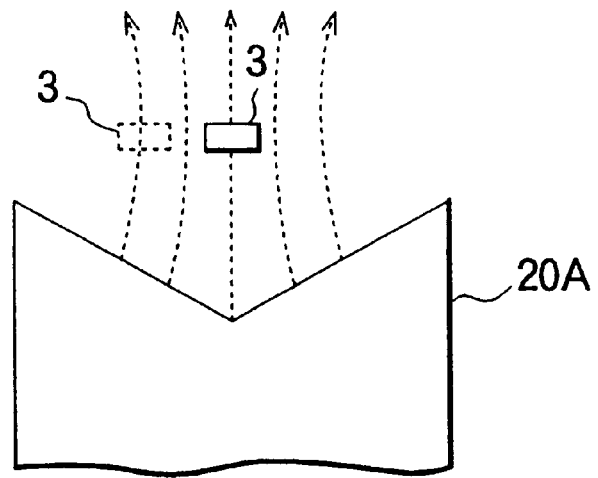
FIG. 4 is a schematic diagram illustrating a magnetic field emerging from a magnet and being directed toward a magnetic field detecting element of a sensing device according to a second embodiment of the invention.

FIG. 4 is a schematic diagram illustrating an essential part of a second embodiment of the invention.

In the present embodiment, unlike the first embodiment in which the surface of the magnet 20 facing the magnetic field detecting element 3 is curved, the magnet 20A serving as the magnetic field generating means has a surface slanted into triangular-shaped planes at its end facing the magnetic field sensing plane of the magnetic field detecting element 3, as shown in FIG. 4. The angle of the above slanted surface is set so that the magnetic field emerging from the magnet 20A passes at a right angle through the magnetic field sensing plane of the magnetic field detecting element 3 regardless of the positioning accuracy of the magnetic field detecting element 3 with respect to the location of the magnet 20A. Furthermore, the magnet 20A is located so that the bottom of the slanted surface of the magnet 20A is coincident with the center of the magnetic field sensing plane of the magnetic field detecting element 3.

In the construction of the present embodiment, the magnetic field emerging from the magnet 20A is directed toward the magnetic field detecting element 3 as follows. Since the surface of the magnet 20A at its end facing the magnetic field sensing plane of the magnetic field detecting element 3 is slanted into the triangular-shaped planes as shown in FIG. 4, the magnetic field emerging from the magnet 20A passes at a right angle through the magnetic field sensing plane of the magnetic field detecting element 3 not only when the magnetic field detecting element 3 is located at a correct position as represented by the solid line in FIG. 4, but even when the location of the magnetic field detecting element 3 is shifted from the center of the magnet 20A as represented by the broken line. Therefore, the positioning error of the magnetic field detecting element 3 causes only a slight change in the direction of the magnetic field vector, and substantially no change occurs in the biasing magnetic field applied to the magnetic field detecting element 3.

Thus, the present embodiment can provide similar effects and advantages to those obtained in the previous embodiment.

Embodiment 3

Figure 5A:
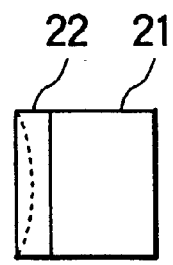
FIGS. 5A and 5B are a plan view and a side view, respectively, illustrating a third embodiment of a sensing device according to the present invention.
Figure 5B:
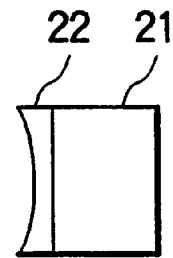

FIG. 5 is a schematic diagram illustrating a third embodiment of the invention wherein its plan view and side view are given in FIGS. 5A and 5B, respectively.

In the present embodiment, the surface of a magnet at its end facing the magnetic field sensing plane of a magnetic field detecting element is covered with a magnetic flux guide whose surface is slanted (or curved) into a predetermined shape so that the magnetic field emerging from the magnet passes at a right angle through the magnetic field sensing plane of the magnetic field detecting element regardless of the positioning accuracy of the magnetic field detecting element with respect to the location of the magnet.

As for the magnet 21 of the present embodiment shown in FIG. 5, a magnet similar to the magnet 4, described above, may be employed. The surface of the magnet 21 at its front end facing the magnetic field sending plane of the magnetic field detecting element 3 (refer to FIG. 1) is covered with a magnetic flux guide 22. The surface of the magnetic flux guide 22 on its side facing the magnetic field sensing plane of the magnetic field detecting element 3 is slanted or curved into a predetermined shape. The curved surface is formed so that the magnetic field emerging from the magnet 21 passes at a right angle through the magnetic field sensing plane of the magnetic field detecting element 3 regardless of the positioning accuracy of the magnetic field detecting element 3 with respect to the location of the magnet 21. Furthermore, the elements are arranged so that the center of the curved surface of the magnetic flux guide 22 is coincident with the center of the magnetic field sensing plane of the magnetic field detecting element 3. In this embodiment, the magnet 21 and the magnetic flux guide 22 form magnetic field generating means.

Figure 6:
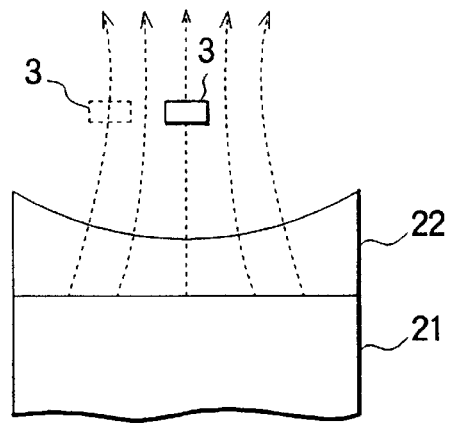
FIG. 6 is a schematic diagram illustrating a magnetic field emerging from a magnet and being directed toward a magnetic field detecting element of the sensing device according to the third embodiment of the invention.

In the construction of the present embodiment, the magnetic field emerging from the magnet 21 is directed toward the magnetic field detecting element 3 as follows. Since the surface of the magnetic flux guide 22, disposed on the end of the magnet 21 facing the magnetic field sensing plane of the magnetic field detecting element 3, is curved as shown in FIG. 6, the magnetic field from the magnet 21 is directed through the magnetic flux guide 22 as shown in FIG. 6 and then passes at a right angle through the magnetic field sensing plane of the magnetic field detecting element 3 not only when the magnetic field detecting element 3 is located at a correct position as represented by the solid line in FIG. 6, but even when the location of the magnetic field detecting element 3 is shifted from the center of the magnet 21 as represented by the broken line. Therefore, the positioning error of the magnetic field detecting element 3 causes only a slight change in the direction of the magnetic field vector, and substantially no change occurs in the bias magnetic field applied to the magnetic field detecting element 3.

Thus, the present embodiment can provide effects and advantages similar to those obtained in the previous embodiments. Furthermore, in the present embodiment, since the surface of the magnet at its end facing the magnetic field sensing plane of the magnetic field detecting element is covered with the magnetic flux guide having a curved surface, it is no longer required to perform the difficult process of forming the surface of the magnet into a curved shape. This allows an improvement in manufacturing.

The surface of the magnetic flux guide 22 at the end facing the magnetic field detecting element 3 may be formed into triangular-shaped planes as shown in FIG. 4, instead of being formed into the curved surface.

Embodiment 4

In the previous embodiments, the magnetic field variation inducing means is realized by a rotary magnetic material member adapted to rotate in synchronization with a rotating shaft. However, the magnetic field variation inducing means may also be realized by a moving member adapted to move along a straight line.

What is claimed is:

1. A sensing device comprising:

magnetic field generating means for generating a magnetic field, said magnetic field generating means comprising a magnet and a magnetic flux guide, said magnetic flux guide having a non-planar surface thereon;

magnetic field variation inducing means for changing the magnetic field generated by said magnetic field generating means, said magnetic field variation inducing means being disposed a predetermined distance apart from said magnetic field generation means; and a magnetic field detecting element that changes in resistance in response to the magnetic field whose magnitude is changed by said magnetic field variation inducing means, wherein said non-planar surface faces said magnetic field detecting element.

2. A sensing device according to claim 1, wherein said non-planar surface is slanted in such a manner as to form a concave surface.

3. A sensing device according to claim 1, wherein said non-planar surface is a V-shaped surface.

4. A sensing device according to claim 1, wherein said magnetic field variation inducing means comprises a rotary magnetic material member having at least one protruding or recessed portion.

5. A sensing device, comprising:

a magnetic field generator that generates a magnetic field, said magnetic field generator comprising a magnet and a magnetic flux guide, said magnetic flux guide having a non-planar, surface thereon;

a magnetic field variation inducer that changes the magnetic field generated by said magnetic field generator, said magnetic field variation inducer disposed a predetermined distance apart from said magnetic field generator; and a magnetic field detecting element that changes in resistance in response to the magnetic field whose magnitude is changed by said magnetic field variation inducer, wherein said non-planar surface faces said magnetic field detecting element.

6. A sensing device according to claim 5, wherein said non-planar, surface is a concave surface.

7. A sensing device according to claim 5, wherein said non-planar, surface is a V-shaped surface.

* * * * *